(12) United States Patent
Nagase et al.

(10) Patent No.: US 9,130,143 B2
(45) Date of Patent: Sep. 8, 2015

(54) MAGNETIC MEMORY AND METHOD FOR MANUFACTURING THE SAME

(71) Applicants: Toshihiko Nagase, Seoul (KR); Daisuke Watanabe, Seoul (KR); Kazuya Sawada, Seoul (KR); Koji Ueda, Seoul (KR); Youngmin Eeh, Seoul (KR); Hiroaki Yoda, Seoul (KR)

(72) Inventors: Toshihiko Nagase, Seoul (KR); Daisuke Watanabe, Seoul (KR); Kazuya Sawada, Seoul (KR); Koji Ueda, Seoul (KR); Youngmin Eeh, Seoul (KR); Hiroaki Yoda, Seoul (KR)

(*) Notice: Subject to any disclaimer, the term of this patent is extended or adjusted under 35 U.S.C. 154(b) by 0 days.

(21) Appl. No.: 14/201,038

(22) Filed: Mar. 7, 2014

(65) Prior Publication Data

US 2015/0069553 A1 Mar. 12, 2015

Related U.S. Application Data

(60) Provisional application No. 61/876,076, filed on Sep. 10, 2013.

(51) Int. Cl.
*G11C 11/16* (2006.01)
*H01L 43/02* (2006.01)
*H01L 43/12* (2006.01)

(52) U.S. Cl.
CPC .............. *H01L 43/02* (2013.01); *G11C 11/161* (2013.01); *H01L 43/12* (2013.01)

(58) Field of Classification Search
CPC ....................................... G11C 11/161
USPC .......................................... 365/158
See application file for complete search history.

(56) References Cited

U.S. PATENT DOCUMENTS

| | | | |
|---|---|---|---|
| 8,405,171 B2* | 3/2013 | Zheng et al. | 257/421 |
| 8,493,780 B2* | 7/2013 | Ranjan et al. | 365/171 |
| 8,514,527 B2* | 8/2013 | Komagaki et al. | 360/324.11 |
| 8,659,103 B2 | 2/2014 | Watanabe et al. | |
| 8,758,850 B2* | 6/2014 | Zhou et al. | 427/130 |
| 2007/0025029 A1 | 2/2007 | Hayakawa et al. | |
| 2009/0096045 A1 | 4/2009 | Hayakawa et al. | |
| 2012/0069642 A1 | 3/2012 | Ueda et al. | |
| 2013/0009259 A1 | 1/2013 | Watanabe et al. | |

OTHER PUBLICATIONS

U.S. Appl. No. 14/152,286, filed Jan. 10, 2014.

* cited by examiner

*Primary Examiner* — Mark Prenty
(74) *Attorney, Agent, or Firm* — Holtz, Holtz, Goodman & Chick PC

(57) ABSTRACT

According to one embodiment, a magnetic memory is disclosed. The magnetic memory includes a substrate, and a magnetoresistive element provided on the substrate. The magnetoresistive element includes a first magnetic layer, a tunnel barrier layer on the first magnetic layer, and a second magnetic layer on the tunnel barrier layer. The first magnetic layer or the second magnetic layer includes a first region, second region, and third region whose ratios of crystalline portion are higher in order closer to the tunneling barrier.

14 Claims, 8 Drawing Sheets

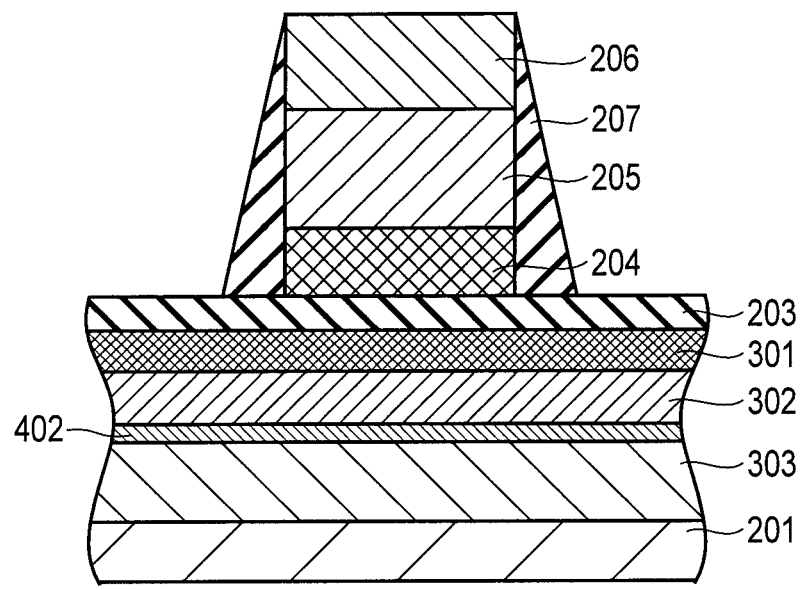
F I G. 12
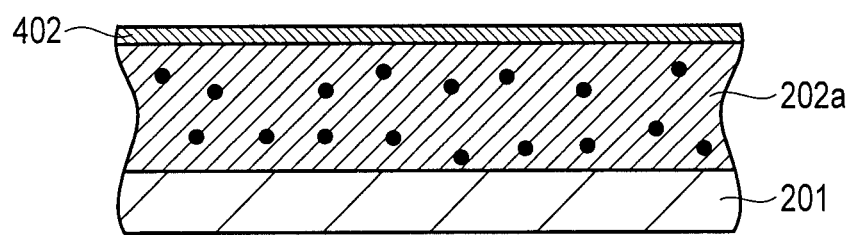
F I G. 13

MAGNETIC MEMORY AND METHOD FOR MANUFACTURING THE SAME

CROSS-REFERENCE TO RELATED APPLICATIONS

This application claims the benefit of U.S. Provisional Application No. 61/876,076, filed Sep. 10, 2013, the entire contents of which are incorporated herein by reference.

FIELD

Embodiments described herein relate generally to a magnetic memory comprising a magnetoresistive element and a method for manufacturing the same.

BACKGROUND

In recent years, a semiconductor memory utilizing a resistance variable element as a memory element, such as a PRAM (phase-change random access memory) or an MRAM (magnetic random access memory), has been attracting attention and being developed. The MRAM is a device which performs a memory operation by storing "1" or "0" information in a memory cell by using a magnetoresistive effect, and has features of nonvolatility, high-speed operation, high integration and high reliability.

One of magnetoresistive effect elements is a magnetic tunnel junction (MTJ) element including a three-layer multilayer structure of a storage layer having a variable magnetization direction, an insulation film as a tunnel barrier, and a reference layer which maintains a predetermined magnetization direction.

The resistance of the MTJ element varies depending on the magnetization directions of the storage layer and the reference layer, it takes a minimum value when the magnetization directions are parallel, and takes a maximum value when the magnetization directions are antiparallel, and information is stored by associating the parallel state and antiparallel state with binary information "0" and binary information "1", respectively.

Write of information into the MTJ element involves a magnetic-field write scheme in which only the magnetization direction in the storage layer is reversed by a current magnetic field that is generated when a current flowing is flowed through a write line, and a write (spin injection write) scheme using spin angular momentum movement in which the magnetization direction in the storage layer is reversed by passing a spin polarization current through the MTJ element itself.

In the former scheme, when the element size is reduced, the coercivity of a magnetic body constituting the storage layer increases and the write current tends to increase, and thus it is difficult to achieve both the miniaturization and low electric current.

On the other hand, in the latter scheme (spin injection write scheme), spin polarized electron to be injected into the MTJ element decreases with the decrease of the volume of the magnetic layer constituting the storage layer, so that it is expected that both the miniaturization and low electric current may be easily achieved.

BRIEF DESCRIPTION OF THE DRAWINGS

FIG. 12 is a cross-sectional view schematically showing an MTJ element according to a third embodiment;

FIG. 13 is a cross-sectional view for explaining a manufacturing method of the MTJ element according to the third embodiment;

DETAILED DESCRIPTION

Figure 1:
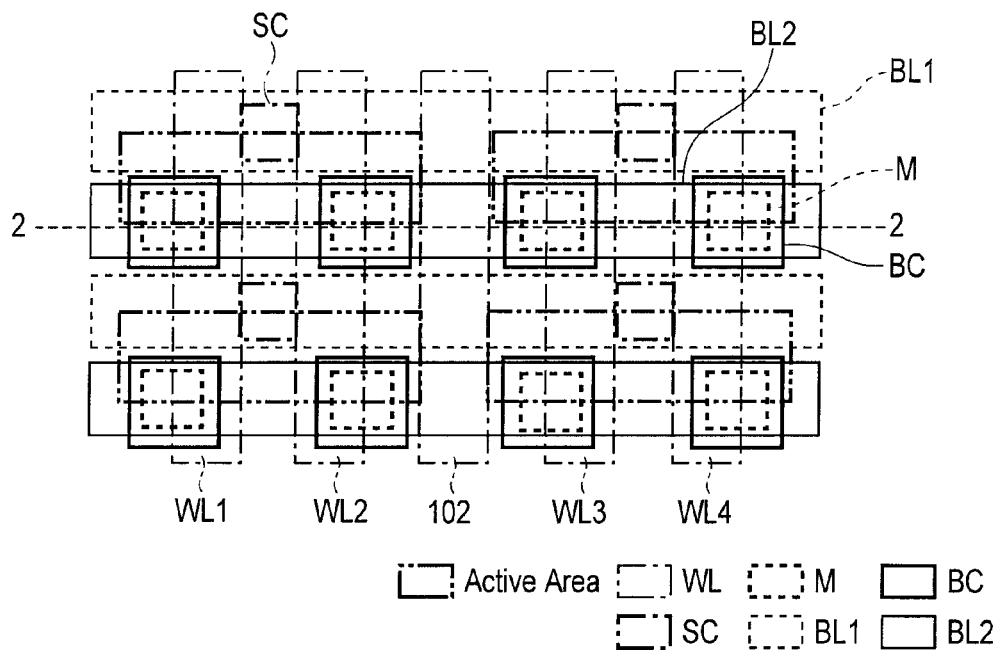
FIG. 1 is a plane view showing an MRAM according to a first embodiment.

Hereinafter the embodiments will be described with reference to the accompanying drawings. In the following drawings, the portions corresponding to the portions shown in the previously mentioned drawings are denoted by the same reference numerals and omitted its detail explanation.

In general, according to one embodiment, a magnetic memory is disclosed. The magnetic memory includes a substrate, and a magnetoresistive element provided on the substrate. The magnetoresistive element includes a first magnetic layer, a tunnel barrier layer on the first magnetic layer, and a second magnetic layer on the tunnel barrier layer. The first magnetic layer or the second magnetic layer includes a first region, second region, and third region whose ratios of crystalline portion are higher in order closer to the tunneling barrier.

According to another embodiment, a magnetic memory is disclosed. The magnetic memory includes a substrate; and a magnetoresistive element provided on the substrate. The magnetoresistive element includes a first magnetic layer, a tunnel barrier layer on the first magnetic layer, and a second magnetic layer on the tunnel barrier layer. The first magnetic layer or the second magnetic layer includes a first region, second region, and third region whose B percentage contents are lower in order closer to the tunneling barrier.

According to still another embodiment, a method for manufacturing a magnetic memory including a substrate and a magnetoresistive element provided on the substrate. The method includes forming a first CoFeB compound layer having a first boron percentage content; forming a second CoFeB compound layer having a second boron percentage content lower than the first boron percentage content; forming a tunnel barrier layer on the second CoFeB compound layer; and forming a first region, second region, and third region whose ratios of crystalline portion are higher in order closer to the tunneling barrier by performing annealing after a formation of the first CoFeB compound and the second CoFeB compound, the first region including a CoFe alloy, the second region including at least one of the $Co_2B$ and $Fe_2B$, the third layer including at least one of the CoB and FeB.

(First embodiment)

Figure 2:
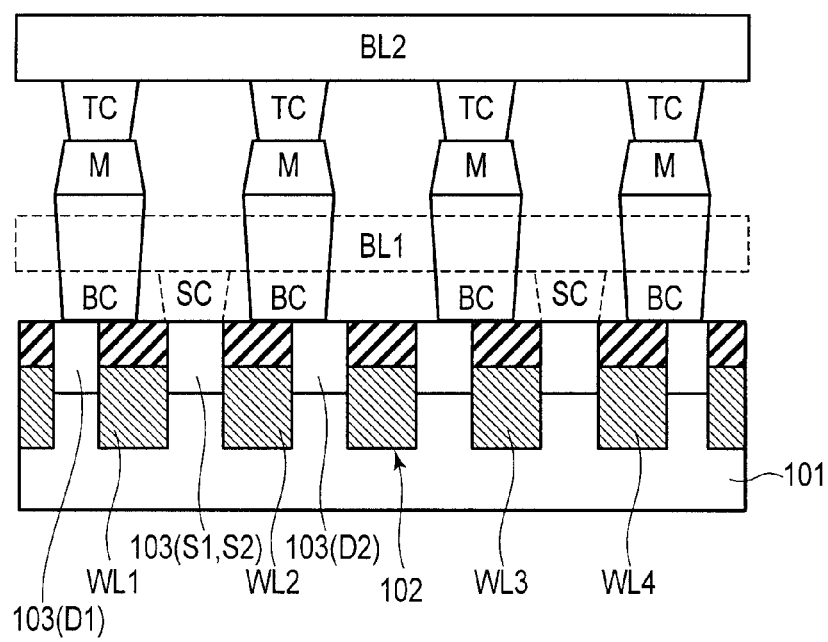
FIG. 2 is a cross-sectional view taken along a line 2-2 in FIG. 1.

FIG. 1 is a plane view schematically showing a magnetic memory according to a first embodiment, FIG. 2 is a cross-sectional view taken along a line 2-2 in FIG. 1. In the present embodiment, the magnetic memory is an MRAM, and a magnetoresistive element is an MTJ element.

In the figure, reference numeral 101 denotes a silicon substrate (semiconductor substrate), a dummy gate electrode 102 is formed in a surface of the silicon substrate. The dummy gate electrode 102 is a gate (a gate insulating film and an underlying gate electrode thereunder (a dummy word line)) embedded in the surface of the silicon substrate 101, a so-called "(BG) buried gate". The dummy gate electrode 102 defines active areas. In the figure, four active areas are shown.

The MRAM of the present embodiment comprises a first selection transistor of which gate electrode is a word line WL1, a first MTJ element M connected to one of source/drain regions 103 (drain region D1) of this first selection transistor, a second selection transistor of which gate electrode is a word line WL2, and a second MTJ element M connected to one of source/drain regions 103 (drain region D2) of this second selection transistor.

That is, one memory cell of the present embodiment comprises one MTJ (memory element) and one selection transistor, the two select transistors of the two neighboring memory cells share the other source/drain region 103 (source region S1, S2).

The gate (gate insulating film, gate electrode) of the select transistor in the present embodiment is the BG as with the dummy gate electrode 102.

One source/drain region 103 (D1) of the first select transistor is connected to a lower part of the first MTJ element M via a plug BC. An upper part of the first MTJ element M is connected to a second bit line BL2 via a plug TC.

The other source/drain region 103 (S1) of the first selection transistor is connected to a first bit line (source line) BL1 via a plug SC.

One of the source/drain region 103 (D2) of the second selection transistor is connected to a lower part of the second MTJ element M via a plug BC. An upper part of the second MTJ element M is connected to the second bit line BL2 via a plug TC.

The other source/drain region 103 (S2) of the second selection transistor is connected to the first bit line BL1 via the plug SC.

The first selection transistor, the first MTJ element M, the second selection transistor, and the second MTJ element (two memory cells) are provided in each active area. Two neighboring active areas are isolated by the dummy gate electrode (BG) 102.

The bit lines BL1 and BL2 are configured to have alternately changed heights (at every two lines). Thereby, a pitch between neighboring BL lines is relaxed to be doubled, and a parasitic capacitance between neighboring bit lines is reduced. In the figure, the bit line BL2 is higher than the bit line BL1, but, conversely, the bit line BL2 may be higher than the bit line BL1.

The word lines WL3 and WL4 correspond to the word line WL1 and WL2, respectively. Accordingly, two memory cells are constituted by a first select transistor of which gate electrode is the word line WL3, a first MTJ element M which is connected to one source/drain region 104 of the first select transistor, a second transistor of which gate electrode is a second word line WL2, and a second MTJ element M which is connected to one source/drain region 104 of the second select transistor.

FIG. 3 to FIG. 6 are cross-sectional views for explaining a method for manufacturing the MTJ element of the MRAM of the present embodiment.

[FIG. 3]

A layer of CoFeB (CoFeB layer) 202a compound having a first boron percentage content, a layer of CoFeB compound (CoFeB layer) 202b having a second boron percentage content lower than the first boron percentage content are successively formed on an underlying layer 201 including a lower electrode (not shown).

Figure 4:
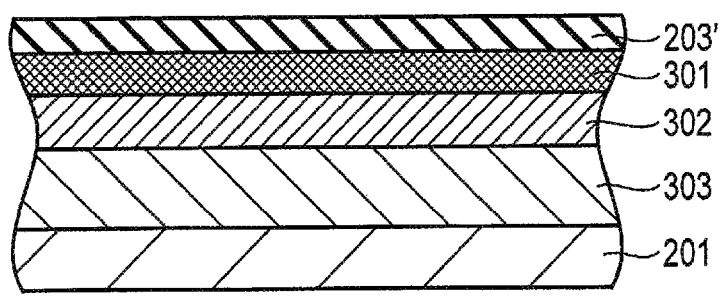
FIG. 4 is a cross-sectional view for explaining a method for manufacturing the MTJ element of the first embodiment following FIG. 3.
Figure 5:
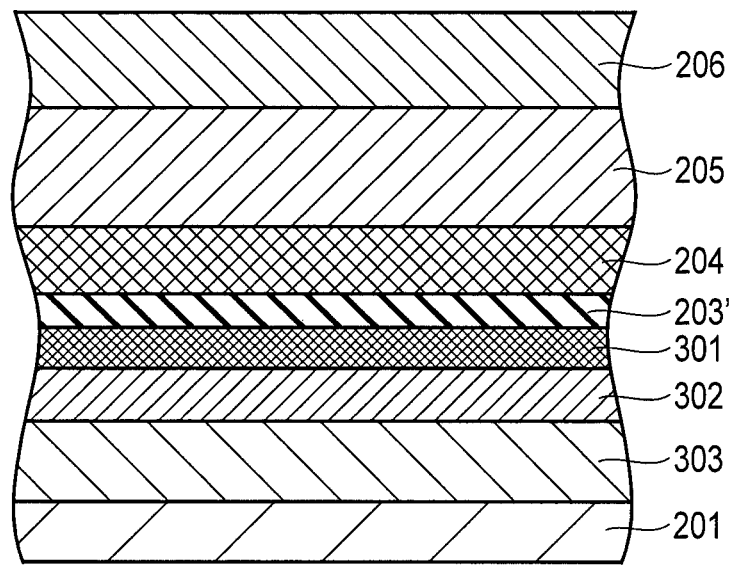
FIG. 5 is a cross-sectional view for explaining a method for manufacturing the MTJ element of the first embodiment following FIG. 4.
Figure 6:
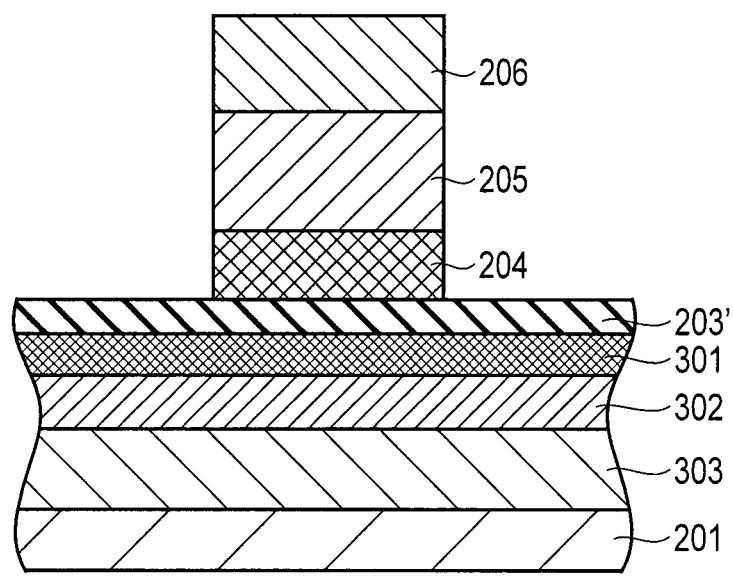
FIG. 6 is a cross-sectional view for explaining a method for manufacturing the MTJ element of the first embodiment following FIG. 5.
Figure 7:
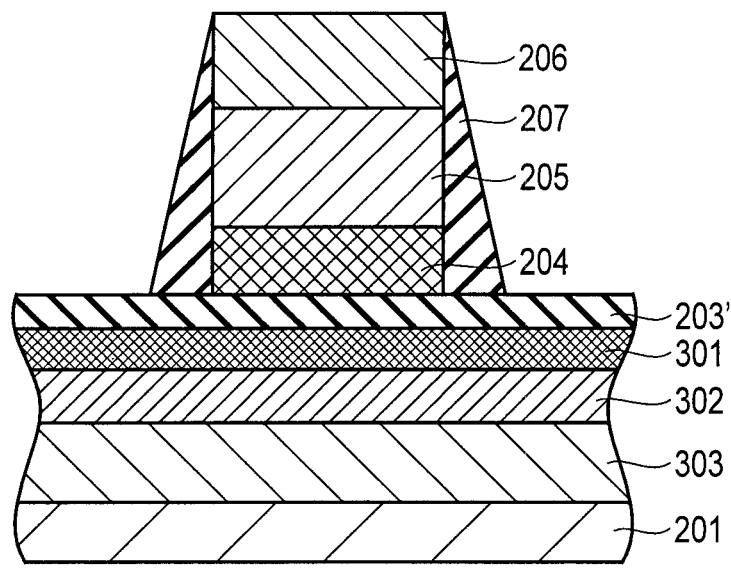
FIG. 7 is a cross-sectional view for explaining a method for manufacturing the MTJ element of the first embodiment following FIG. 6.

It is preferable that the underlying layer 201 does not include a layer for controlling crystal orientation of a storage layer 301 shown in FIG. 4; but, the underlying layer 201 may contain it. The CoFeB layers 202a and 202b are formed by using, for example, sputtering method.

The first and second boron percentage contents are, for example, 50% and 20%, respectively. The CoFeB layers 202a and 202b have an amorphous structure and/or a nanocrystal structure. The CoFeB layer 202 is not sufficiently crystallized at this stage (before annealing).

A magnesium oxide layer (MgO layer) 203 is formed on the CoFeB layer 202b. The MgO layer 203 is not sufficiently crystallized at this stage (before annealing).

[FIG. 4]

An annealing is performed to the MgO layer 203, the CoFeB layers 202a, 202b. This annealing is performed, for example, in a temperature range of 300° C. to 500° C.

Through this annealing, the MgO layer 203 is turned into a sufficiently crystallized MgO layer (tunnel barrier layer) 203', and the CoFeB layers 202a and 202b are turned into a layer including a first layer 301, second layer 302, and third layer 303 whose ratios of crystalline portion are higher in order closer to the MgO layer 203'.

The first layer 301 exhibits stronger magnetism than the second layer 302 and the third layer 303. The second and third layers 302, 303 may not exhibit magnetism such as ferromagnetism. The second layer 302 may exhibit stronger magnetism stronger than the third layer 303. The boron percentage content of the first layer 301 is lower than boron percentage contents of the second and third layers 302, 303. The boron percentage content of the second layer 302 is generally lower than boron percentage content of the third layer 303.

The first layer 301 is, specifically, a layer of CoFe alloy (CoFe layer). This CoFe layer 301 has, for example, a thickness of 1 to 1.5 nm. After the annealing, the boron percentage content of the CoFe layer 301 is significantly reduced as compared to before the annealing. The boron percentage content of the CoFe layer 301 after the annealing may be below the detection limit. One of the reasons why the CoFe layer 301 is formed is because B in the CoFeB layer 202b removes into the CoFeB layer 202a by the annealing.

Through the annealing, the MgO layer 203' is crystallized to be oriented preferentially to a (100) plane. The CoFe layer 301 is also crystallized to be oriented preferentially to the (100) plane, and then the CoFe layer 301 is formed to be lattice matched with the MgO layer 203'. The CoFe layer 301 has a body centered cubic (bcc) structure.

The second layer 302 is, specifically, a layer including at least one of $Co_2B$ and $Fe_2B$ (hereinafter referred to as $(Co-Fe)_2B$ layer). This $(Co-Fe)_2B$ layer 302 has a thickness of, for example, 2 nm. The (Co—Fe)$_2$B layer 302 may have a partially crystallized structure or, for example, an amorphous structure.

Figure 8:
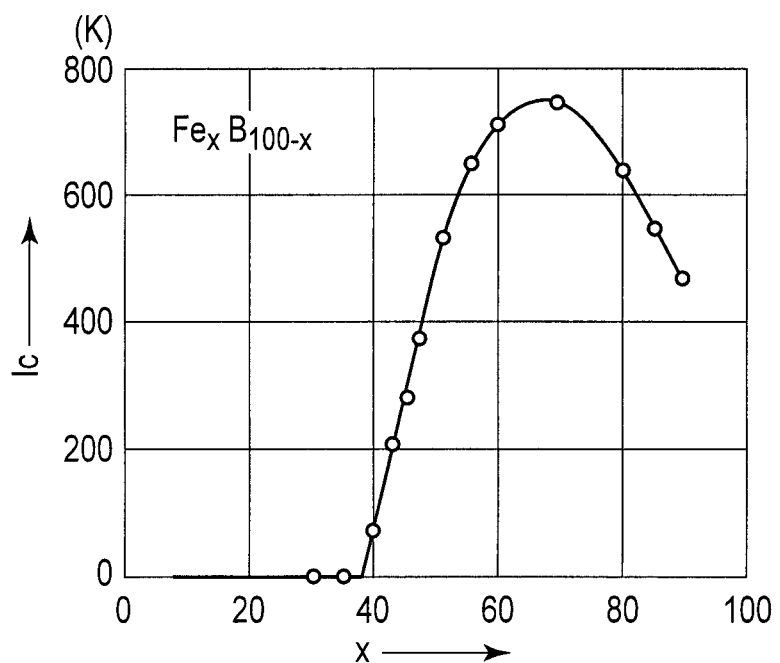
FIG. 8 illustrates a relationship between boron concentration (at %) of FeB compound and Curie temperature.

As shown in FIG. 8, FeB compound of amorphous structure loses its magnetism when the boron percentage content thereof is 45 at % or more at the room temperature. On the other hand, the CoB compound having the crystal structure with boron percentage content of 50 at % or more has lost its magnetism.

The third layer 303 is, specifically, a layer including at least one of Feb and CoB (hereinafter referred to as (Co—Fe)B layer). The (Co—Fe)B layer 303 has, for example, an amorphous structure. The (Co—Fe)B layer 303 may have a partially crystallized structure.

Figure 9:
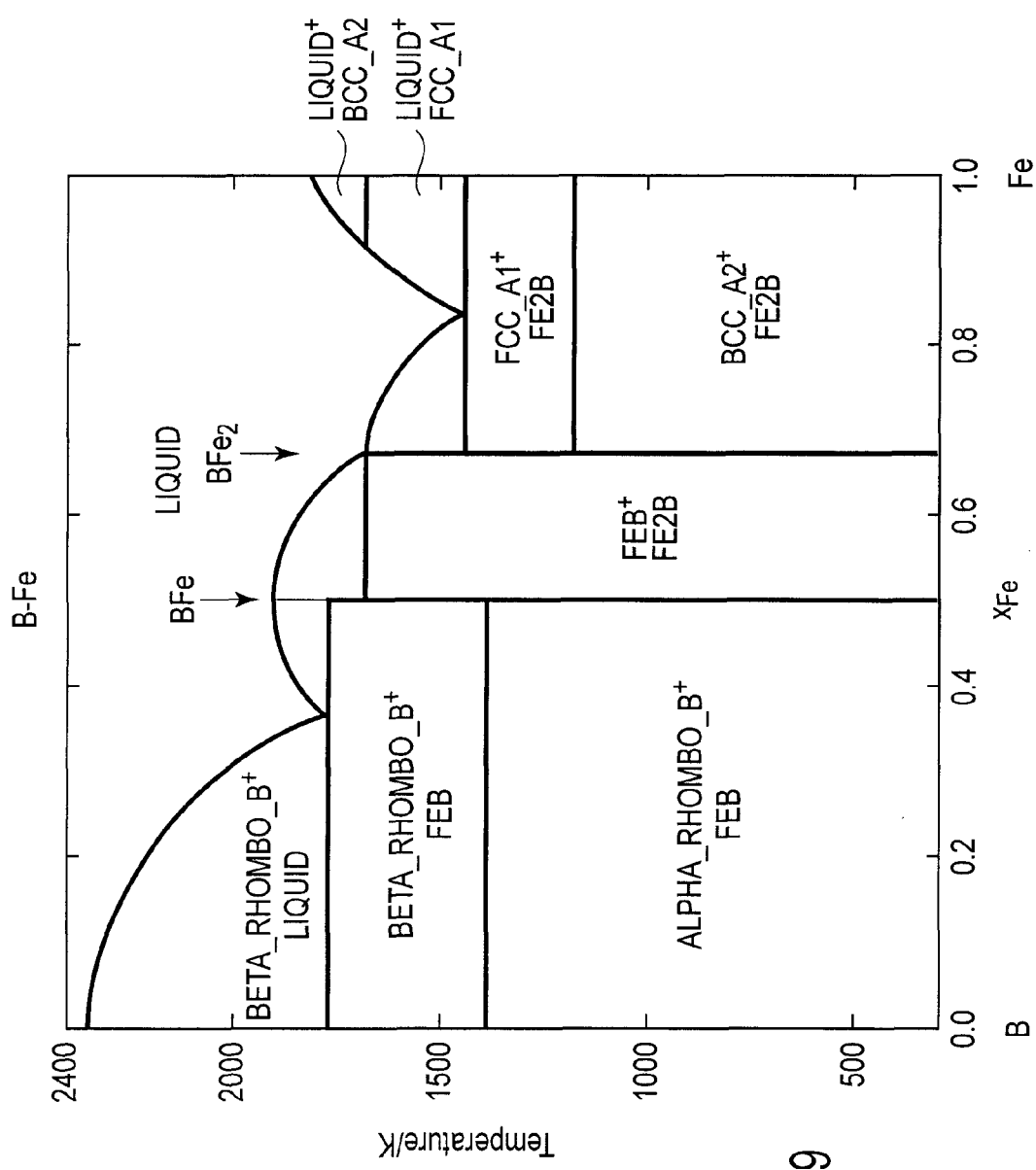
FIG. 9 is a B—Fe phase diagram.

The reason why Fe$_2$B, FeB are formed by the annealing is because B in the CoFeB layer 202b removes into the CoFeB layer 202a, and as shown in B—Fe phase diagram of FIG. 9, because Feb compound becomes stable (becomes solid) in Feb and Fe$_2$B compositions. CoB and Co$_2$B, which are CoB compound, are formed for a similar reason.

The annealing for the MgO layer 203 and the CoFeB layer 202a, 202b may be performed after forming a hard mask 206 described below.

[FIG. 5]

A reference layer 204, a shift cancelling layer 205 are successively formed on the MgO layer 203' which is the tunnel barrier layer, thereafter, a hard mask having conductivity is formed on the shift cancelling layer 205.

The reference layer 204 includes, for example, an alloy of Pt (precious metal) and Co (magnetic substrate). The shift cancelling layer 205 has a function to less and adjust a shift of reversal current of the storage layer 301 caused by a leakage magnetic field from the reference layer 204. The hard mask 206 includes, for example, Ta or Ru.

The annealing explained with reference to FIG. 4 may be performed after the hard mask 206 is formed.

[FIG. 6]

The shift cancelling layer 205 and the reference layer 204 are etched by RIE (reactive ion etching) process using the hard mask 206 as a mask, and a surface of the tunnel barrier layer 203 is exposed.

[FIG. 7]

By well-known method, a sidewall 207 having insulating property is formed on the side walls of the reference layer 204 and the shift adjustment layer 205. The material of the sidewall 207 is, for example, silicon nitride.

Thereafter, well-known method process such as etching the MgO (tunnel barrier) layer 203', storage layer 301 and underlying layer 201 by IBE process using the hard mask 206 and sidewall 207 as masks.

(Second embodiment)

Figure 10:
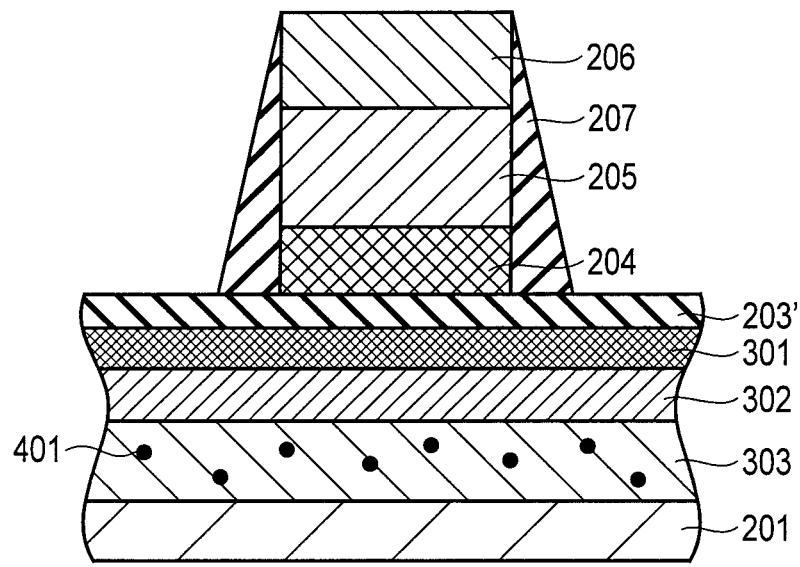
FIG. 10 is a cross-sectional view schematically showing an MTJ element according to a second embodiment.

FIG. 10 is a cross-sectional view schematically showing an MTJ element of an MRAM according to a second embodiment.

The present embodiment is different from the first embodiment in that the (Co—Fe)B layer 303 includes a substance 401 to suppress grain growth of the CoFeB layer. The (Co—Fe)$_2$B layer 302 may also include the substance 401. The substance 401 includes at least one of Ti, V, Cr, Zr, Nb, Mo, Hf, W, and Ta.

Figure 11:
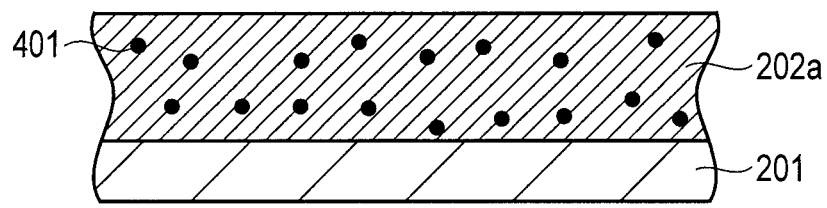
FIG. 11 is a cross-sectional view for explaining a method for manufacturing the MTJ element according to the second embodiment.

FIG. 11 is a cross-sectional view for explaining a method for manufacturing the MTJ element of the present embodiment.

The CoFeB layer 202a with high B percentage content, which includes the substance 401 to suppress the grain growth, is formed on the underlying layer 201. The CoFeB layer 202a is formed by, for example, sputtering method using a sputter target including a material corresponding to the substance 401.

Thereafter, the MTJ element of the present embodiment is obtained through the same steps as described in the first embodiment (FIGS. 3 to 6).

Figure 3:
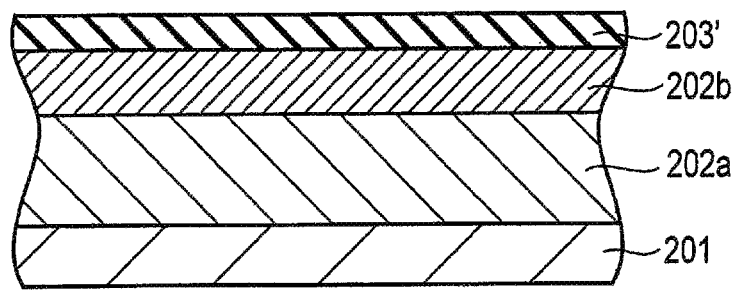
FIG. 3 is a cross-sectional view for explaining a method for manufacturing the MTJ element of the first embodiment.

In case of the present embodiment, the substance 401 works as a nucleus of the grain growth during the annealing process in FIG. 3, and a large grain is suppressed from growing in the (Co—Fe)B layer 303 and (Co—Fe)$_2$B layer 302. As a result, flatness (crystallinity) of the CoFe layer 301 and the MgO layer 203 is improved. Furthermore, as described below, since the substance 401 easily forms a compound in conjunction with B, the substance 401 has a function to assist in decreasing the boron percentage content of the CoFe layer 301. The concentration of the substance 401 in the CoFeB layer 202a is lowest near the tunnel barrier layer and is higher with distance from the tunnel barrier.

(Third embodiment)

FIG. 12 is a cross-sectional view schematically showing an MTJ element of an MRAM of a third embodiment. The present embodiment is different from the first embodiment in that an intermediate layer 402 for controlling the thickness of the CoFe layer 301 is provided between the (Co—Fe)B layer 303 and (Co—Fe)$_2$B layer 302. The material of the intermediate layer 402 includes at least one of Ti, V, Cr, Zr, Nb, Mo, Hf, W, and Ta. Since the intermediate layer 402 easily forms a compound in conjunction with B, the intermediate layer 402 draws B from the CoFe layer 301. As a result, the CoFe layer 301 is thicken. That is, the thickness of the CoFe layer 301 can be controlled by the amount of the material of the intermediate layer 402.

FIG. 13 is a cross-sectional view for explaining a method for manufacturing the MTJ element of the present embodiment.

The CoFeB layer 202a is formed on the underlying layer 201, thereafter, the intermediate layer 402 is formed on the CoFeB layer 202a. The forming of the CoFeB layer 202a and the intermediate layer 402 are formed by using, for example, sputtering method. After this, the MTJ element of the present embodiment is obtained through the similar steps as described in the first embodiment.

(Fourth embodiment)

Figure 14:
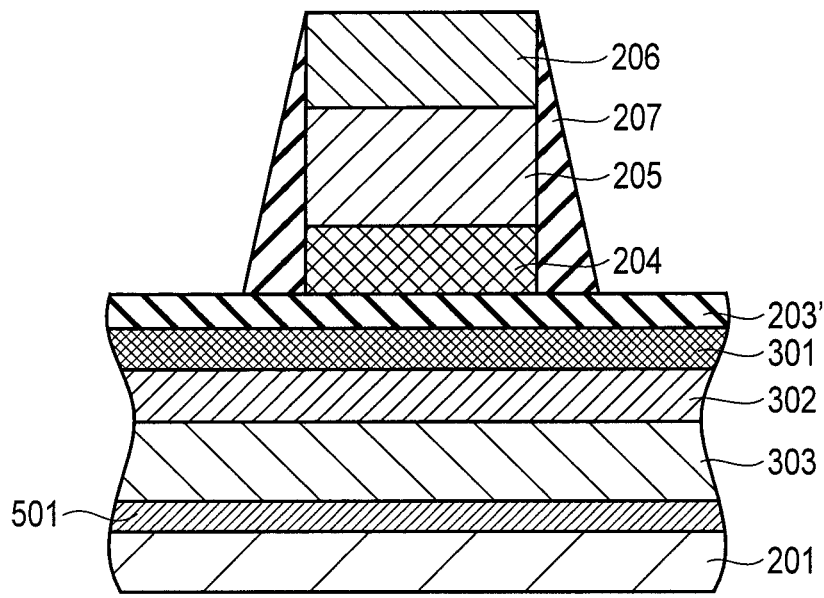
FIG. 14 is a cross-sectional view schematically showing an MTJ element according to a fourth embodiment.

FIG. 14 a cross-sectional view schematically showing an MTJ element of an MRAM of a fourth embodiment.

In the present embodiment, the underlying layer 201 including a nitride layer 501 is used. In FIG. 14 the nitride layer 501 is the uppermost layer of the underlying layer 201. However, the whole underlying layer 201 may be replaced with the nitride layer 501.

Figure 15:
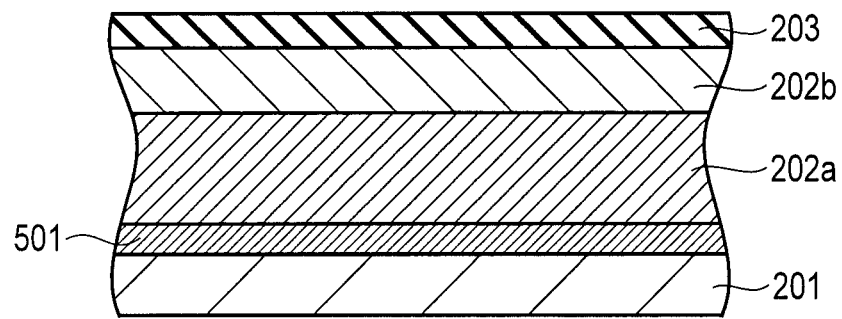
FIG. 15 is a cross-sectional view for explaining a method for manufacturing an MTJ element according to a fourth embodiment.

FIG. 15 is a cross-sectional view for explaining a method for manufacturing the MTJ element of the present embodiment, and FIG. 15 corresponds to FIG. 3 of the first embodiment.

The CoFeB layer 202a with high B percentage content is formed on the nitride layer 501. Since the nitride layer 501 suppress a diffusion of B, the boron concentration of the CoFeB layer 202a is maintained high. Thereby, the (Co—Fe)B layer 303, (Co—Fe)$_2$B layer 302, and CoFe layer 301 can be easily formed.

In a case where the nitride layer 501 is a titanium nitride layer (nitride layer having conductivity), the titanium nitride layer may be used as the lower electrode.

The present embodiment is applicable to the second and third embodiments.

The above-described embodiments are applicable not only to the storage layer but also to the reference layer, furthermore, applicable to both the storage layer and the reference layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a substrate; and
a magnetoresistive element provided on the substrate, the magnetoresistive element comprising:
a first magnetic layer;
a tunnel barrier layer on the first magnetic layer; and
a second magnetic layer on the tunnel barrier layer,
wherein the first magnetic layer or the second magnetic layer includes a first region, second region, and third region whose ratios of crystalline portion are higher in order closer to the tunnel barrier layer.

2. The magnetic memory according to claim 1, wherein each of the first region, second region and third region comprises different magnetic materials.

3. The magnetic memory according to claim 1, wherein the third region does not exhibit magnetism.

4. The magnetic memory according to claim 1, wherein the tunnel barrier layer comprises magnesium oxide, and the first region comprises a CoFe alloy.

5. The magnetic memory according to claim 4, wherein the second region comprises at least one of $Co_2B$ and $Fe_2B$.

6. The magnetic memory according to claim 4, wherein the third region comprises at least one of CoB and FeB which has a crystal structure.

7. The magnetic memory according to claim 4, wherein the third region comprises an amorphous structure containing Co and B.

8. The magnetic memory according to claim 7, wherein a boron percentage content of the Co and B in the amorphous structure is 50 at % or more.

9. The magnetic memory according to claim 6, wherein the third region comprises an amorphous structure containing Fe and B, and a boron percentage content of the Fe and B in the amorphous structure is 45 at % or more.

10. The magnetic memory according to claim 9, wherein the third region comprises at least one of Ti, V, Cr, Zr, Nb, Mo, Hf, W, and Ta.

11. The magnetic memory according to claim 1, further comprising:
an intermediate layer provided between the second and third regions.

12. The magnetic memory according to claim 11, wherein the intermediate layer comprises at least one of Ti, V, Cr, Zr, Nb, Mo, Hf, W, and Ta.

13. A magnetic memory comprising:
a substrate; and
a magnetoresistive element provided on the substrate, the magnetoresistive element comprising:
a first magnetic layer;
a tunnel barrier layer on the first magnetic layer; and
a second magnetic layer on the tunnel barrier layer,
wherein the first magnetic layer or the second magnetic layer includes a first region, second region, and third region whose B percentage contents are lower in order closer to the tunnel barrier layer.

14. The magnetic memory according to claim 13, further comprising:
a nitride layer, and wherein the first magnetic layer is provided on the nitride layer.

* * * * *